(12) United States Patent
Chen et al.

(10) Patent No.: US 10,038,022 B1
(45) Date of Patent: Jul. 31, 2018

(54) LIGHT DETECTOR

(71) Applicant: Au Optronics Corporation, Hsinchu (TW)

(72) Inventors: Te-Ming Chen, Hsinchu County (TW); Tsung-Han Chen, New Taipei (TW); Sheng-Chen Wu, Hsinchu County (TW); Geng-Qun Zhou, Taoyuan (TW); Ying-Hsien Chen, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/784,199

(22) Filed: Oct. 16, 2017

(30) Foreign Application Priority Data

Sep. 4, 2017 (TW) .............................. 106130155 A (51) Int. Cl.
*H01L 27/146* (2006.01)
*H01L 31/0203* (2014.01)

(52) U.S. Cl.
CPC .... *H01L 27/1462* (2013.01); *H01L 27/14612* (2013.01); *H01L 27/14623* (2013.01); *H01L 27/14636* (2013.01); *H01L 27/14649* (2013.01); *H01L 27/14663* (2013.01); *H01L 31/0203* (2013.01)

(58) Field of Classification Search
USPC ......................................................... 257/72
See application file for complete search history.

(56) References Cited

U.S. PATENT DOCUMENTS

| | | | | | |
|---|---|---|---|---|---|
| 5,276,329 | A | * | 1/1994 | Hughes | G01T 1/2018 250/370.09 |
| 6,628,680 | B2 | * | 9/2003 | Kaneko | G02B 6/12004 257/440 |
| 6,777,685 | B2 | | 8/2004 | Lee | |
| 9,105,369 | B2 | * | 8/2015 | Koehler | A61B 6/032 |
| 9,164,045 | B2 | * | 10/2015 | Munro | G01N 23/046 |
| 9,597,050 | B2 | * | 3/2017 | Roessl | A61B 6/484 |
| 9,651,683 | B2 | * | 5/2017 | Ootorii | H01L 27/14663 |

(Continued)

FOREIGN PATENT DOCUMENTS

| | | |
|---|---|---|
| CN | 102629610 | 8/2012 |
| CN | 202796958 | 3/2013 |
| CN | 104037179 | 9/2014 |

*Primary Examiner* — Julio J Maldonado
*Assistant Examiner* — Lawrence Tynes, Jr.
(74) *Attorney, Agent, or Firm* — JCIPRNET (57) ABSTRACT

A light detector including an invisible light converting substrate, a light sensing element, a first protection layer, a thin film transistor, a first conductive pattern and a second protection layer is provided. The light sensing element and the thin film transistor are disposed on the invisible light converting substrate. The first protection layer covers the invisible light converting substrate and a second electrode of the light sensing element. The first protection layer has a via overlapped with the second electrode of the light sensing element. The first conductive pattern is disposed on the first protection layer and electrically connected to the second electrode of the light sensing element through the via of the first protection layer. The first conductive pattern is electrically connected between the second electrode of the light sensing element and a source of the thin film transistor.

19 Claims, 4 Drawing Sheets

(56) References Cited

U.S. PATENT DOCUMENTS

| | | | |
|---|---|---|---|
| 9,705,024 B2* | 7/2017 | Jiang | H01L 31/117 |
| 9,726,622 B2* | 8/2017 | Momose | G01N 23/20075 |
| 2002/0014592 A1 | 2/2002 | Rutten et al. | |
| 2003/0010942 A1* | 1/2003 | Kuwabara | G01T 1/2928 |
| | | | 250/580 |
| 2004/0113085 A1 | 6/2004 | Heismann et al. | |
| 2005/0263709 A1* | 12/2005 | Watanabe | H01L 27/14643 |
| | | | 250/370.11 |
| 2008/0142721 A1 | 6/2008 | Spahn | |
| 2008/0230123 A1* | 9/2008 | Mitsui | C09B 23/0066 |
| | | | 136/263 |
| 2010/0076304 A1* | 3/2010 | Teramura | A61B 3/102 |
| | | | 600/425 |
| 2010/0238381 A1* | 9/2010 | Oshima | G02F 1/133603 |
| | | | 349/71 |
| 2010/0243908 A1 | 9/2010 | Shoji et al. | |
| 2011/0180714 A1* | 7/2011 | Okada | G01T 1/243 |
| | | | 250/354.1 |
| 2012/0153169 A1* | 6/2012 | Nariyuki | G01T 1/202 |
| | | | 250/366 |
| 2012/0161005 A1* | 6/2012 | Tsuchiya | G01J 5/0225 |
| | | | 250/338.3 |
| 2012/0169962 A1* | 7/2012 | Yuki | G01J 1/02 |
| | | | 349/61 |
| 2012/0189101 A1* | 7/2012 | Kaneko | A61B 6/4291 |
| | | | 378/62 |
| 2012/0219114 A1 | 8/2012 | Iwakiri et al. | |
| 2012/0299175 A1* | 11/2012 | Tran | B82Y 10/00 |
| | | | 257/712 |
| 2013/0320338 A1 | 12/2013 | Ono et al. | |
| 2014/0034950 A1 | 2/2014 | Li | |
| 2015/0103977 A1 | 4/2015 | Ono et al. | |
| 2015/0270429 A1* | 9/2015 | Jiroku | H01L 31/105 |
| | | | 257/458 |
| 2015/0295006 A1 | 10/2015 | Chen et al. | |
| 2016/0072071 A1* | 3/2016 | Yumura | H01L 51/0047 |
| | | | 320/101 |
| 2016/0181342 A1* | 6/2016 | Choi | H01L 51/5256 |
| | | | 257/81 |
| 2016/0320003 A1* | 11/2016 | Yuan | C09K 11/02 |
| 2016/0351764 A1* | 12/2016 | Cha | H01L 33/58 |
| 2017/0003782 A1* | 1/2017 | Heo | G06F 3/044 |
| 2017/0012067 A1* | 1/2017 | Jiang | H01L 27/14623 |
| 2017/0077348 A1* | 3/2017 | Lim | H01L 33/14 |
| 2017/0373111 A1* | 12/2017 | Tomyo | H01L 27/14636 |
| 2018/0061876 A1* | 3/2018 | Miyamoto | H01L 27/14614 |

* cited by examiner

LIGHT DETECTOR

CROSS-REFERENCE TO RELATED APPLICATION

This application claims the priority benefit of Taiwan application serial no. 106130155, filed on Sep. 4, 2017. The entirety of the above-mentioned patent application is hereby incorporated by reference herein and made a part of this specification.

BACKGROUND OF THE DISCLOSURE

Field of the Disclosure

The disclosure is related to a detector, and particularly to a light detector.

Description of Related Art

A light detector utilizes substrate of different elements and adhesive to adhere different substrates. However, the adhesive makes the light required for the light detector to be scattered and consequently and the imaging quality of the light detector is not good.

In addition, in the substrate of different elements in the light detector, a plurality of controlling elements are required for reading and/or a plurality of light sensing elements are required for sensing. However, when the controlling elements have read problem and/or the light sensing elements have sensing problem, it is likely to cause too many white defects in acquired image and thus not acceptable for the user. Although a repairing process may be applied to repair the reading operation of the controlling elements and/or the sensing operation of the light sensing elements, still, the controlling elements are likely to have reading problem and/or the light sensing elements are likely to have sensing problem, and the repairing operation is not easy.

SUMMARY OF THE DISCLOSURE

In an exemplary embodiment of the disclosure, the light detector includes an invisible light converting substrate, a light sensing element, a first protection layer, a thin film transistor, a first conductive pattern and a second protection layer. The invisible light converting substrate converts an invisible light into a visible light. The light sensing element is disposed on the invisible light converting substrate to detect the visible light. The light sensing element includes a first electrode, a second electrode and an optoelectric converting layer disposed between the first electrode and the second electrode. The first electrode is close to the invisible light converting substrate, the second electrode is away from the invisible light converting substrate, and the material of the first electrode includes a transparent or a semi-transparent material. The first protection layer covers the invisible light converting substrate and the second electrode of the light sensing element. The first protection layer has a via, and the via is overlapped with at least part of the second electrode. The thin film transistor is disposed on the invisible light converting substrate. The thin film transistor includes a gate electrode, a semiconductor layer, a gate insulating layer, a source electrode and a drain electrode electrically connected with the semiconductor layer, wherein the semiconductor layer is disposed between the gate electrode and the source electrode as well as between the gate electrode and the drain electrode. The gate insulating layer is disposed between the semiconductor layer and the gate electrode. The first conductive pattern is disposed on the first protection layer. The first conductive pattern is electrically connected with the second electrode of the light sensing element through the via of the first protection layer. The first conductive pattern is electrically connected between the second electrode of the light sensing element and the source electrode of the thin film transistor. The second protection layer covers the thin film transistor, the first conductive pattern and the light sensing element.

In order to make the aforementioned features and advantages of the disclosure more comprehensible, embodiments accompanying figures are described in detail below.

DESCRIPTION OF EMBODIMENTS

Reference will now be made in detail to the present preferred embodiments of the disclosure, examples of which are illustrated in the accompanying drawings. Those skilled in the art should understand that the provided embodiments can be modified in different ways without departing from the spirit or the scope of the disclosure.

It will be understood that when an element, such as a layer, a film a region or a substrate, is referred to as being "on," "connected to" or "coupled to" another element, it can be directly on, connected or coupled to the other element or intervening elements may be present. In contrast, when an element is referred to as being "directly on", "directly connected to" or "directly coupled to" another element, there are no intervening elements present. As used herein, the term "connected with or coupled to" may refer to physically and/or electrically connected with or electrically coupled to.

The terms used herein such as "about", "approximate", or "substantial" include a related value and an average within an acceptable deviation range of specific values determined by those with ordinary skills in the art with consideration of discussed measurement and a specific number of errors related to the measurement (i.e. a limitation of a measurement system). For example, the term "about" represents to be within one or a plurality of standard deviations of the related value, or within ±30%, ±20%, ±10%, ±5%. Moreover, an acceptable range of deviation or standard deviation may be chosen for the terms "about", "close to" or "substantial" used herein based on optical properties, etching properties, or other properties, instead of applying one standard deviation across all the properties.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
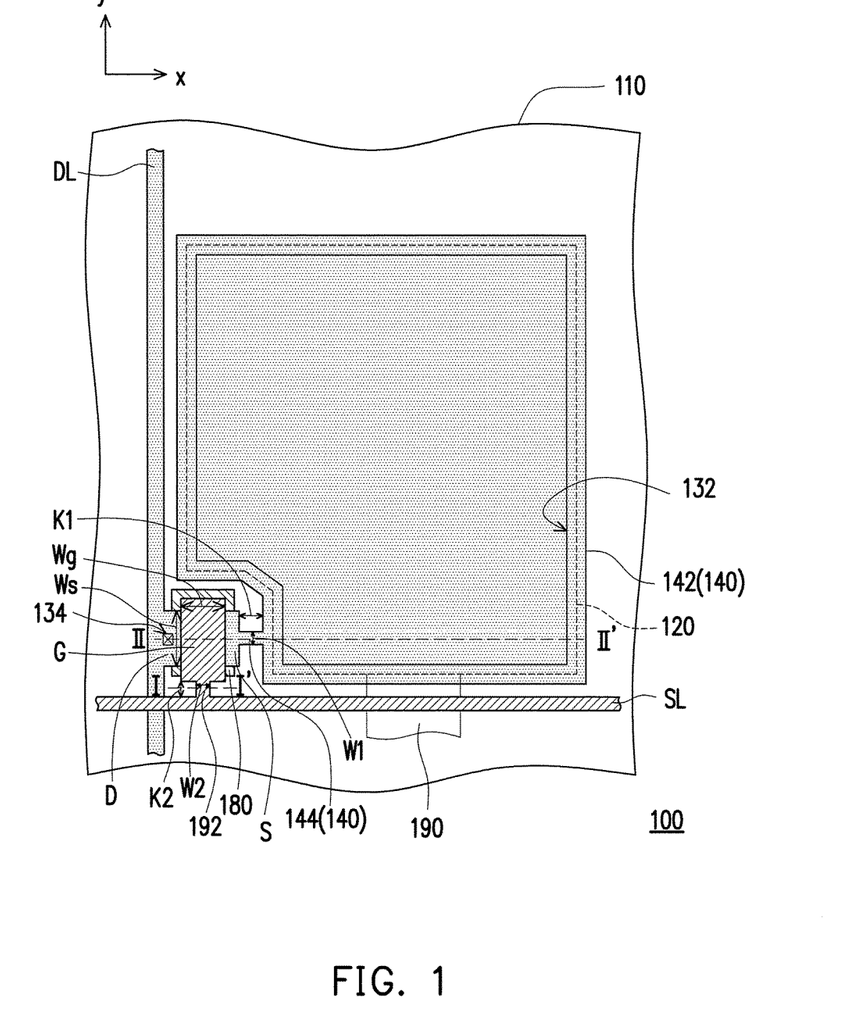
FIG. 1 is a top schematic view of a light detector according to an embodiment of the disclosure.
Figure 2:
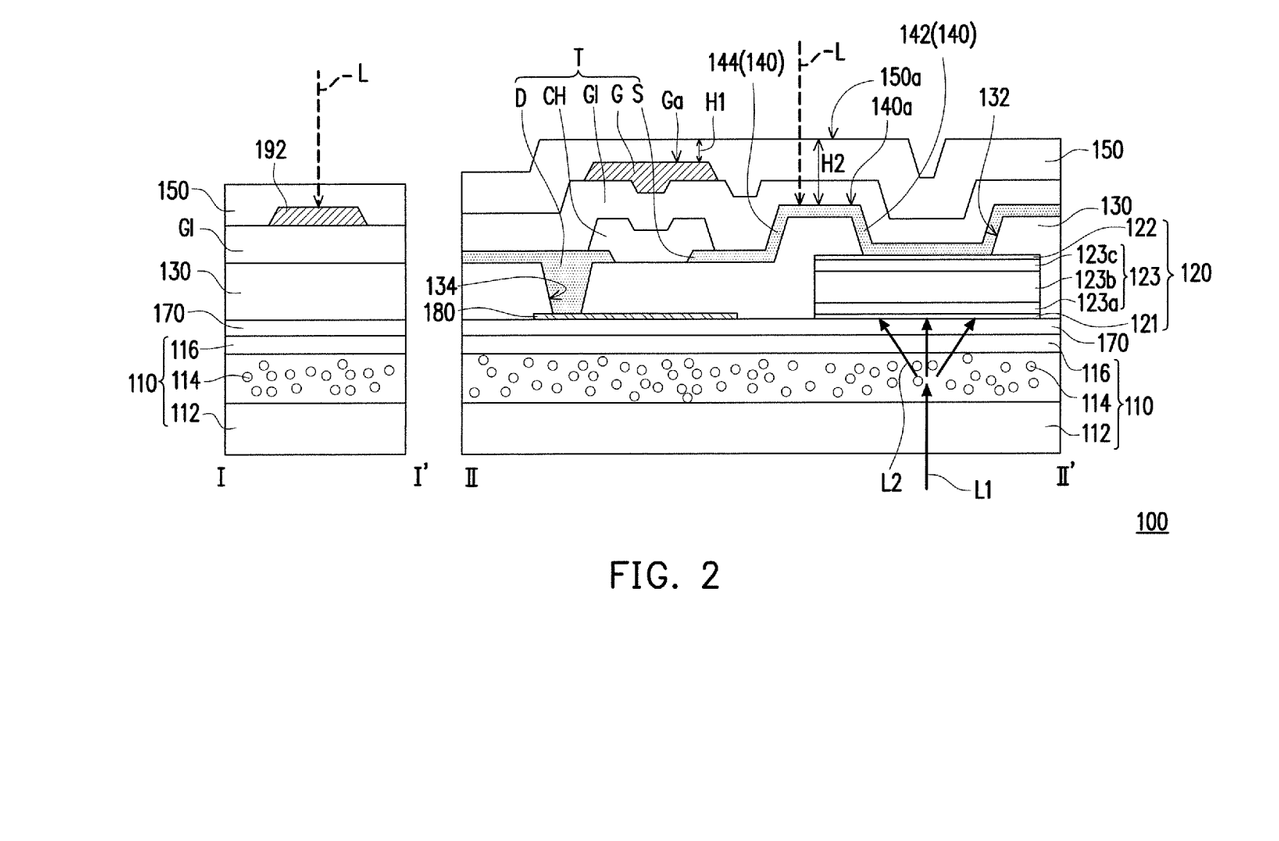
FIG. 2 is a cross-sectional view of a light detector according to an embodiment of the disclosure.

FIG. 1 is a top schematic view of a light detector according to an embodiment of the disclosure. FIG. 2 is a cross-sectional view of a light detector according to an embodiment of the disclosure. In particular, FIG. 2 corresponds to line I-I' and II-II' in FIG. 1. Referring to FIG. 1 and FIG. 2, a light detector 100 includes an invisible light converting substrate 110, a light sensing element 120, a first protection layer 130, a thin film transistor T, a first conductive pattern 140 and a second protection layer 150. The invisible light converting substrate 110 converts an invisible light L1 into a visible light L2 (for example: a wavelength range of the visible light is about 390 nm to 700 nm). In the embodiment, the invisible light L1 is, for example, an X-ray, which should not be construed as a limitation to the disclosure. In other embodiment, the invisible light L1 may be an infrared light, a UV light, a γ light, or other wavelength range of the invisible light.

The light sensing element 120 is disposed on the invisible light converting substrate 110 so as to sense the visible light L2. For example, in the embodiment, the invisible light converting substrate 110 includes a first substrate (or namely first base) 112 and an invisible light wavelength converting material 114 disposed on the first substrate (or namely first base) 112. The light sensing element 120 may be directly disposed on an inner surface of the invisible light converting substrate 110; for example, the light sensing element 120 can be directly disposed on the invisible light wavelength converting material 114 of the invisible light converting substrate 110. Therefore, the invisible light converting substrate 110 converts the invisible light L1 into the visible light L2 by the invisible light wavelength converting material 114. In other embodiment, the light detector 100 may selectively include a buffering layer 170 disposed on the invisible light converting substrate 110. The light sensing element 120 may be disposed on the buffering layer 170, and the light sensing element 120 may be directly disposed on the inner surface of the invisible light converting substrate 110; for example, the light sensing element 120 is directly disposed on the buffering layer 170 on the invisible light wavelength converting material 114. In another embodiment, the invisible light converting substrate 110 may selectively further include a second substrate (or namely second base) 116. The invisible light wavelength converting material 114 is disposed between the first substrate (or namely first base) 112 and the second substrate (or namely second base) 116, and the light sensing element 120 may be directly disposed on the inner surface of the invisible light converting substrate 110; for example, the light sensing element 120 is directly disposed on a top surface (which serves as the inner surface of the invisible light converting substrate) of the second substrate (or namely second base) 116 of the invisible light converting substrate 110. Specifically, the top surface (which serves as the inner surface of the invisible light converting substrate 110) of the second substrate (or namely second base) 116 may selectively include the buffering layer 170, and the light sensing element 120 may be directly disposed on the inner surface of the invisible light wavelength converting substrate 110; for example, the light sensing element 120 may be directly disposed on the buffering layer 170 on the invisible light wavelength converting material 114, which should not be construed as a limitation to the disclosure. In other embodiment, the invisible light converting substrate 110 may be designed in other forms; the embodiment will be exemplified below with reference to other drawings.

The material of the first substrate (or namely first base) 112 and the second substrate (or namely second base) 116 may be a transparent or a semi-transparent material. For example, in the embodiment, the material of at least one of the first substrate (or namely first base) 112 and the second substrate (or namely second base) 116 may be an organic polymer (e.g., polyimide (PI), polyethylene terephthalate (PET), polyethylene naphthalate (PEN) or other suitable materials), glass, quartz or other suitable materials. In the embodiment, the invisible light wavelength converting material 114 has, for example, gadolinium oxysulfide (GOS), yttrium aluminum garnet (YAG), yttrium gadolinium aluminum gallium garnet (YGAG), gadolinium aluminum gallium garnet (GAGG), gadolinium gallium garnet (GGG), cadmium tungstate (CdffO4), zinc selenide (ZnSe), MSi2O2N2:Eu2+, Ba3Si6O12N2:Eu2+, SrSi5AlO2N7:Eu2+, SrSiAl2O3N2:Eu2+, CaAlSiN3:Eu2+, M2Si5N8:Eu2+, MSiN2:Eu2+, cesium iodide (CsI), derivative of the above, other suitable garnet phosphor powder, other suitable non-garnet oxide phosphor powder, other suitable sulfide phosphor powder, other suitable nitride and oxynitride phosphor powder, or a combination of at least two materials mentioned above.

The buffering layer 170 may be a single-layered or a multiple-layered structure, and the material thereof may be an inorganic material (e.g., silicon oxide, silicon nitride, silicon oxynitride, or other suitable material), an organic material (e.g., polyimide (PI), polyethylene terephthalate (PET), polyethylene naphthalate (PEN) or other suitable materials), or other suitable materials. Specifically, the buffering layer 170 does not include an adhesive material (e.g., optical clear adhesive (OCA), hydro gel and so on) and may be regarded as free of adhesion layer.

The light sensing element 120 includes at least two electrodes (e.g., first electrode 121, second electrode 122) and an optoelectric converting layer 123 disposed between the two electrodes (e.g., first electrode 121 and second electrode 122). In the embodiment, it is exemplified that the first electrode 121 is configured to be closer to (or namely near to) the invisible light converting substrate 110 (e.g., the first electrode 121 is closer to the inner surface of the invisible light converting substrate 110), the second electrode 122 is configured to be farther from (or namely away from) the invisible light converting substrate 110 (e.g., the first electrode 121 is farther from the inner surface of the invisible light converting substrate 110), which should not be construed as a limitation to the disclosure. In other embodiment, the second electrode 122 may be configured to be closer the invisible light converting substrate 110, and the first electrode 121 may be configured to be farther from (or namely away from) the invisible light converting substrate 110. The electrode (e.g., first electrode 121) that is closer to the invisible light converting substrate may be a single-layered or a multiple-layered structure, and the material thereof includes a transparent or a semi-transparent conductive material such as zinc oxide (ZnO), indium tin oxide (ITO), indium zinc oxide (IZO), indium gallium zinc oxide (IGZO), indium gallium oxide (IGO), zinc gallium oxide (ZGO), graphite, carbon nano-tube/rod, metal or alloy less than 60 Å, or other suitable material. The visible light L2 can pass through the electrode (e.g., first electrode 121) that is closer to the invisible light converting substrate to be incident to an optoelectric converting layer 123. The optoelectric converting layer 123 can convert the visible light L2 into a corresponding electric signal. For example, in the embodiment, the optoelectric converting layer 123 includes at least two stacked semiconductor layers 123a, 123b or 123b, 123c. In some part of the embodiment, the optoelectric converting layer 123 may include a p-type semiconductor layer 123a and an i-type semiconductor layer 123b, or include an n-type semiconductor layer 123c and an i-type semiconductor layer 123b. Preferably, the optoelectric converting layer 123 may include a p-type semiconductor layer 123a, an i-type semiconductor layer 123b and an n-type semiconductor layer 123c, or a p-type semiconductor layer 123a and an n-type semiconductor layer 123c, which should not be construed as a limitation to the disclosure. Additionally, in the embodiment, the second electrode 122 is away from the invisible light converting substrate 110, and the material of the second electrode 122 having the single-layered or multiple-layered structure may be selected according to whether the first conductive pattern 140 covers the light sensing element 120 as well as the material of the first conductive pattern 140. For example, if the first conductive pattern 140 includes a non-transparent conductive material and not completely cover the light sensing element 120, then the material of the second electrode 122 is preferably selected from a reflective conductive material (or referred to as non-transparent conductive material), or a stacked layer of a reflective conductive material and a transparent conductive material. Specifically, the transparent conductive material of the second electrode 122 overlaps the first conductive pattern 140, and the reflective conductive material of the second electrode 122 overlaps the part exposed by (or namely not shielded by) the first conductive pattern 140. If the first conductive pattern 140 includes the transparent conductive material and completely covers the light sensing element 120, then the material of the second electrode 122 is preferably selected from the reflective conductive material, or a stacked layer of the reflective conductive material and the transparent conductive material. If the first conductive pattern 140 includes the non-transparent conductive material and completely covers the light sensing element 120, then the material of the second electrode 122 may be selected from the transparent or semi-transparent conductive material. In other embodiment, even in the condition that the first conductive pattern 140 completely covers the light sensing element 120, in consideration of conductivity, the material of the first conductive pattern 140 may be selected from a stacked layer of the transparent conductive material and the reflective conductive material. The reflective conductive material includes metal, alloy or other suitable material. The transparent or semi-transparent conductive material may be selected from the material of the electrode (e.g., first electrode 121) that is closer to the invisible light converting substrate, and the material of the second electrode 122 and the first electrode 121 may be substantially the same or different.

It should be mentioned that the light sensing element 120 is disposed on the invisible light converting substrate 110. In other words, the light sensing eluent 120 is formed (e.g., directly formed) on the invisible light converting substrate 110 as described in the previous or following embodiment's. Therefore, it is not required to use a glue layer (or referred to as adhesion layer) such as an OCA for the light sensing element 120 to be combined with (or fixed to) the invisible light converting substrate 110. In this manner, the visible light L2 converted by the invisible light converting substrate 110 can be transmitted to the light sensing element 120 without passing through the glue layer. In other words, the visible light L2 is not scattered by the glue layer before being transmitted to the light sensing element 120, and thus an imaging quality of the light detector 100 can be improved.

In the embodiment, the light detector 100 may selectively further include a conductive line 190 (shown in FIG. 1). The conductive line 190 is disposed on the invisible light converting substrate 110 and electrically connected with the electrode (e.g., first electrode 121) that is closer to the invisible light converting substrate 110 in the light sensing element 120. In other embodiment, the electrode that is closer to the invisible light converting substrate 110 may be the second electrode 122, then the conductive line 190 may be electrically connected with the second electrode 122 that is closer to the invisible light converting substrate 110 in the light sensing element 120. For example, each of a light detecting unit at least includes a thin film transistor T and the light sensing element 120 that is electrically connected to the thin film transistor T. The light detector 100 may include a plurality of light detecting units, and the electrode (e.g., first electrode 121) that is closer to the invisible light converting substrate 110 in each of the light detecting units is, for example, a common electrode, and the conductive line 190 may be electrically connected between a plurality of first electrodes 120 adjacent to the plurality of light detecting units. In brief, the conductive line 190 may be a common electrode line. In the embodiment, the conductive line 190 may be selectively formed in the same layer along with the first electrode 121, which should not be construed as a limitation to the disclosure.

The first protection layer 130 covers the invisible light converting substrate 110 and the second electrode 122 of the light sensing element 120. The first protection layer 130 has a via 132. The via 132 is overlapped with at least part (or namely portion) of the second electrode 122, or the via 132 exposes at least part (or namely portion) of the second electrode 122. In the embodiment, the first protection layer 130 may be a single-layered or a multiple-layered structure, and the material thereof may be selected from the inorganic material, the organic material or other suitable material; no further descriptions are incorporated herein.

The thin film transistor T is disposed on the invisible light converting substrate 110. The thin film transistor T includes a gate electrode G, a semiconductor layer CH, a gate insulating layer GI and a source electrode S and a drain electrode D that are electrically connected with the semiconductor layer CH. The semiconductor layer CH is disposed between the gate electrode G and the source electrode S as well as between the gate electrode G and the drain electrode D. In other word, the semiconductor layer CH is disposed between the gate electrode G, the source electrode S, and the drain electrode D. The gate insulating layer GI is disposed between the semiconductor layer CH and the gate electrode G. For example, in the embodiment, the source electrode S and the drain electrode D may be disposed on the first protection layer 130. The semiconductor layer CH may cover a portion of the source electrode S, a portion of the drain electrode D and a portion of the first protection layer 130. The gate insulating layer GI may at least cover the semiconductor layer CH, and the gate electrode G may be disposed on the gate insulating layer GI. In the embodiment, the gate electrode G may be disposed above the semiconductor layer CH, and the thin film transistor T may be selectively a top gate type of the thin film transistor (top gate TFT). In the embodiment, the semiconductor layer CH, the gate insulating layer GI and the gate electrode G may be disposed on the source electrode S and the drain electrode D. The gate electrode G is disposed on the upper side of the semiconductor layer CH, and the source electrode S and/or the drain electrode D may be disposed on the lower side of the semiconductor layer CH, and the thin film transistor T may be selectively a staggered thin film transistor (staggered TFT). FIG. 2 is exemplified with the staggered TFT and top gate TFT, which should not be construed as a limitation to the disclosure. Other types of top gate TFT may be adapted for the light detector 100. For example, in another embodiment that is not shown, the semiconductor layer CH may be disposed on the first protection layer 130, the source electrode S and the drain electrode D may respectively cover different two regions of the semiconductor layer CH. The gate insulating layer GI may cover the source electrode S, the drain electrode D and a portion of the first protection layer 130. The gate electrode G may be disposed on the gate insulating layer GI. The gate electrode G, the source electrode S and the drain electrode D may be disposed on the same side of the semiconductor layer CH, and the thin film transistor T may be a coplanar TFT. In another embodiment that is not shown, other suitable top gate thin transistor, for example, the semiconductor layer CH may be disposed on the first protection layer 130. The gate insulating layer GI may at least cover the semiconductor layer CH and a portion of the first protection layer 130. The gate electrode G may be disposed on the gate insulating layer GI, and the source electrode S and the drain electrode D are electrically connected with the semiconductor layer CH. Specifically, the semiconductor layer CH may be a single-layered or a multiple-layered structure, and the material thereof includes an oxide semiconductor (e.g., indium zinc oxide (IZO), indium tin oxide (ITO), zinc oxide (ZnO), indium gallium zinc oxide (IGZO), indium gallium oxide (IGO), or other suitable material), organic semiconductor material, carbon nano-tube/rod, amorphous silicon, mono-crystalline silicon, microcrystalline silicon, polysilicon, nano-crystalline silicon, or other suitable semiconductor material.

In the embodiment, the light detector 100 may selectively further include a light shielding pattern 180. In other embodiment, the light shielding pattern may not be present. The light shielding pattern 180 is disposed between the invisible light converting substrate 110 and the thin film transistor T. The light shielding pattern 180 is overlapped with at least part (or namely portion) of the semiconductor layer CH. Specifically, the light shielding pattern 180 may be overlapped with a portion of the semiconductor layer CH that is not blocked by any reflective element (e.g., source electrode S and drain electrode D). By using the light shielding pattern 180 to block at least a portion of the semiconductor layer CH, the visible light L2 that is converted by the invisible light converting substrate 110 is not easily irradiated onto the semiconductor layer CH so as to avoid photo current leakage generated by the thin film transistor T.

In the embodiment, the light shielding pattern 180 may selectively have a predetermined electrical potential. The predetermined electrical potential includes a fixed electrical potential (e.g., about 0V, ground, or floating electrical potential) or an adjustable non-zero electrical potential. In the embodiment, the light shielding pattern 180 may be selectively electrically connected with the drain electrode D of the thin film transistor T. For example, the first protection layer 130 further has the via 134 that is partially overlapped with the light shielding pattern 180, or the via 134 exposes the portion of the light shielding pattern 180, and the drain electrode D may be electrically connected with the light shielding pattern 180 through the via 134; however, the disclosure provides no limitation thereto. In other embodiment, the light shielding pattern 180 may be electrically connected with other suitable element other than the drain electrode D. In the embodiment, the light shielding pattern 180 may be a single-layered or a multiple-layered structure, and the material thereof is a light shielding and/or a reflective material such as a metal, an alloy, a nitride of the above-mentioned material, an oxide of the above-mentioned material, an oxynitride of the above-mentioned material or other suitable conductive material. In some part of the embodiment, the light shielding pattern 180 may be a stacked layer of a transparent conductive material and a reflective material (or referred to as non-transparent conductive material), and the reflective material is at least overlapped with the portion of the semiconductor layer CH that is not blocked by any reflective element (e.g., source electrode S and drain electrode D), and the area that the transparent conductive material is stacked with the reflective material may be adjusted depending on the configuration.

In the embodiment, the light detector 100 may further include a data line DL and a scan line SL. The data line DL is disposed on the invisible light converting substrate 110 and electrically connected with the drain electrode D. The scan line SL is disposed on the invisible light converting substrate 110 and electrically connected with the gate electrode G. An extending direction of the scan line SL is different from an extending direction Y of the data line DL; for example, the extending direction x of the scan line SL may be interlaced with, e.g., substantially perpendicular to, the extending direction y of the data line DL, which should not be construed as a limitation to the disclosure. In addition, the scan line SL and the data line DL belong to different layers. For example, in the embodiment, the scan line SL and the gate electrode G may belong to the same layer, and the data line DL, the source electrode S and the drain electrode D may belong to another layer, which should not be construed as a limitation to the disclosure. In consideration of conductivity, in the embodiment, at least one of the scan line SL and data line DL may be a single-layered or a multiple-layered structure, and the material thereof may be selected from metal, alloy, nitride of the above-mentioned material, oxide of the above-mentioned material, oxynitride of the above-mentioned material, or other suitable conductive material.

The first conductive pattern 140 is disposed on the first protection layer 130. For example, in the embodiment, the first conductive pattern 140 may be disposed between the gate insulating layer GI and the first protection layer 130, which should not be construed as a limitation to the disclosure. The first conductive pattern 140 is electrically connected with the second electrode 122 of the light sensing element 120 through the via 132 of the first protection layer 130, and the first conductive pattern 140 is electrically connected between the electrode (e.g., second electrode 122) that is farther from the invisible light converting substrate 110 in the light sensing element 120 and the source electrode S of the thin film transistor T. For example, in the embodiment, the first consecutive pattern 140 includes a main portion 142 and a repairing portion 144. The main portion 142 is filled into the via 132 of the first protection layer 130 so as to cover the light sensing element 120 and to be electrically connected with the light sensing element 120. The repairing portion 144 is disposed outside the area of the light sensing element 120 and is electrically connected between the main portion 142 and the source electrode S of the thin film transistor T.

The second protection layer 150 covers the thin film transistor T, the first conductive pattern 140 and the light sensing element 120. For example, in the embodiment, the second protection layer 150 may directly cover the gate electrode G of the thin film transistor T and the gate insulating layer GI. A distance H1 between a gate surface Ga of the gate electrode G and a surface 150a of the second protection layer 150 is smaller than a distance H2 between a surface 140a of the first conductive pattern and the surface 150a of the second protection layer 150. The gate surface Ga may refer to a partial surface of the gate electrode G that is farthest from the invisible light converting substrate 110, and the surface 150a of the second protection layer 150 may refer to a partial surface of the second protection layer 150 that is farthest from the invisible light converting substrate 110. The surface 140a of the first conductive pattern 140 may refer to a partial surface of the first conductive pattern 140 that is farthest from the invisible light converting substrate 110. In the embodiment, the second protection layer 150 may be a single-layered or a multiple-layered structure, and the material thereof may be selected from the material of the first protection layer 130; the material of the second protection layer 150 and the material of the first protection layer 130 may be selectively and substantially the same or different.

In the embodiment, when an error is occurred to the thin film transistor T and/or the light sensing element 120, the repairing portion 144 may be opened so as to avoid that the data line DL reads an erroneous electrical signal. For example, a laser light L may be used to weld (or namely cut) the repairing portion 144 so as to open the repairing portion 144. Since the first conductive pattern 140 is disposed on the first protection layer 130, and the repairing portion 144 is closer to the laser light source, and the repairing portion 144 is away from the electrode (e.g., first electrode 121) and/or the light shielding pattern 180 (exemplified as the light shielding pattern 180) that are closer to the invisible light converting substrate 110, when using the laser light L to open the repairing portion 144, the laser light L can be transmitted to the repairing portion 144 without passing through a region near the electrode (e.g., first electrode 121) and/or the light shielding pattern 180 (exemplified as light shielding pattern 180) that are closer to the invisible light converting substrate 110. In this manner, if the energy of the laser light L and/or the film thickness of the repairing portion 144 is adjusted well, in the process of using the laser light L to open the repairing portion 144, it is less likely for the laser light L to be easily transmitted to the repairing portion 144 as well as the electrode (e.g., first electrode 121) and/or the light shielding pattern 180 (exemplified as light shielding pattern 180) that are closer to the invisible light converting substrate 110 so as to weld the repairing portion 144 as well as the electrode (e.g., first electrode 121) and/or the light shielding pattern 180 (exemplified as light shielding pattern 180) that are closer to the invisible light converting substrate 110. Accordingly, the risk of causing the source electrode S as well as the electrode (e.g., first electrode 121) and/or the light shielding pattern 180 (exemplified as light shielding pattern 180) that are closer to the invisible light converting substrate 110 to be short-circuited due to opening the repairing portion 144 can be reduced.

In addition, since the repairing portion 144 is close to an upper surface (i.e., surface 150a) of the light detector 100, there is no need for the laser light L to pass through too many layers before being transmitted to the repairing portion 144, and thus the laser light L with smaller energy can be used to open the repairing portion 144 and form an open portion (not shown) having a smaller size. In this manner, a length K1 (shown in FIG. 1) of the repairing portion 144 may be designed to be shorter, thereby increasing the area (or referred to as filler factor) for configuring the light sensing element 120. In addition, in the repairing step, it is more likely to avoid causing damage to the light sensing element 120 and/or the invisible light wavelength converting material 114 in the invisible light converting substrate 110, and thus the sensing quality of the light detector 100 before/after the repairing process does not change too much.

As shown in FIG. 1, in the embodiment, a width W1 of the repairing portion 144 in the direction y may be selectively smaller than a width Ws of the source electrode S in the direction y. In this manner, the laser light L can open the repairing portion 144 more easily without welding other element; however, the disclosure is not limited thereto. In other embodiment, the width W1 of the repairing portion 144 is not necessarily smaller than the width Ws of the source electrode S. In addition, in the embodiment, the main portion 142, the repairing portion 144, the source electrode S and the drain electrode D may be selectively formed in the same layer so as to simplify the manufacturing process of the light detector 100, which should not be construed as a limitation to the disclosure. In the embodiment, the first conductive pattern 140 may be a single-layered or a multiple-layered structure, and the material thereof may be selected from the above-mentioned reflective material, the transparent conductive material or other suitable material. Specifically, the previous descriptions may serve as reference for the material and design of the first conductive pattern 140 and the electrode (e.g., second electrode 122) that is farther from the invisible light converting substrate 110; no further descriptions are incorporated herein.

In the embodiment, the light detector 100 may selectively further include a second conductive pattern 192. In other embodiment, the light detector 100 may not include the second conductive pattern 192. The second conductive pattern 192 is electrically connected between the gate electrode G and the scan line SL. The second conductive pattern 192 is disposed on the gate insulating layer GI. The second protection layer 150 covers the second conductive pattern 192. The second conductive pattern 192 may be regarded as another repairing portion. When an error is occurred to the thin film transistor T, the second conductive pattern 192 may be opened so as to avoid that the data line DL reads an erroneous electrical signal. For example, in the embodiment, the laser light L may be used to weld (or namely cut) the second conductive pattern 192 so as to open the second conductive pattern 192. Since the second conductive pattern 192 is disposed on the gate insulating layer GI, and the second conductive pattern 192 is closer to the laser light source, and the second conductive pattern 192 is away from the electrode (e.g., first electrode 121) and/or the light shielding pattern 180 (exemplified as light shielding pattern 180) that are closer to the invisible light converting substrate 110, when using the laser light L to open the second conductive pattern 192, the laser light L can be transmitted to the second conductive pattern 192 without passing through the region near the electrode (e.g., first electrode 121) and/or the light shielding pattern 180 (exemplified as light shielding pattern 180) that are closer to the invisible light converting substrate 110. In this manner, in the process of using the laser light L to open the second conductive pattern 192, the laser light L is not easily transmitted to the second conductive pattern 192 as well as the electrode (e.g., first electrode 121) and/or the light shielding pattern 180 (exemplified as light shielding pattern 180) that are closer to the invisible light converting substrate 110 so as to weld the second conductive pattern 192 as well as the electrode (e.g., first electrode 121) and/or the light shielding pattern 180 (exemplified as light shielding pattern 180) that are closer to the invisible light converting substrate 110. Accordingly, the risk of causing the gate electrode G and the electrode (e.g., first electrode 121) and/or the light shielding pattern 180

(exemplified as light shielding pattern 180) that are closer to the invisible light converting substrate 110 to be short-circuited due to opening the second conductive pattern 192 can be reduced.

In addition, since the second conductive pattern 192 is close to the upper surface (i.e., surface 150a) of the light detector 100, it is not required for the laser light L to pass through too many layers before being transmitted to the second conductive pattern 192, and thus the laser light L with smaller energy can be used to open the second conductive pattern 192 and form an open portion having a smaller size. Accordingly, a length K2 (shown in FIG. 1) of the second conductive pattern 192 may be designed to be shorter, and thus a light sensing area (or referred to as filler factor) of the light sensing element 120 can be increased.

In the embodiment, a width W2 of the second conductive pattern 192 in the direction x may be selectively smaller than a width Wg of the gate electrode G in the direction x; in this manner, the laser light L can open the second conductive pattern 192 more easily without welding other element, which should not be construed as a limitation to the disclosure. In other embodiment, the width W2 of the second conductive pattern 192 may not be necessarily smaller than the width Wg of the gate electrode G. In addition, in the embodiment, the second conductive pattern 192 and the gate electrode G may be selectively formed in the same layer, which should not be construed as a limitation to the disclosure. The second conductive pattern 192 may be a single-layered or a multiple-layered structure, and the material thereof may be selected from a material of one of the scan line or the data line. Moreover, the second conductive pattern 192 may be selectively and substantially the same as the material of one of the scan line or the data line or different from the material of one of the scan line or the data line.

Figure 3:
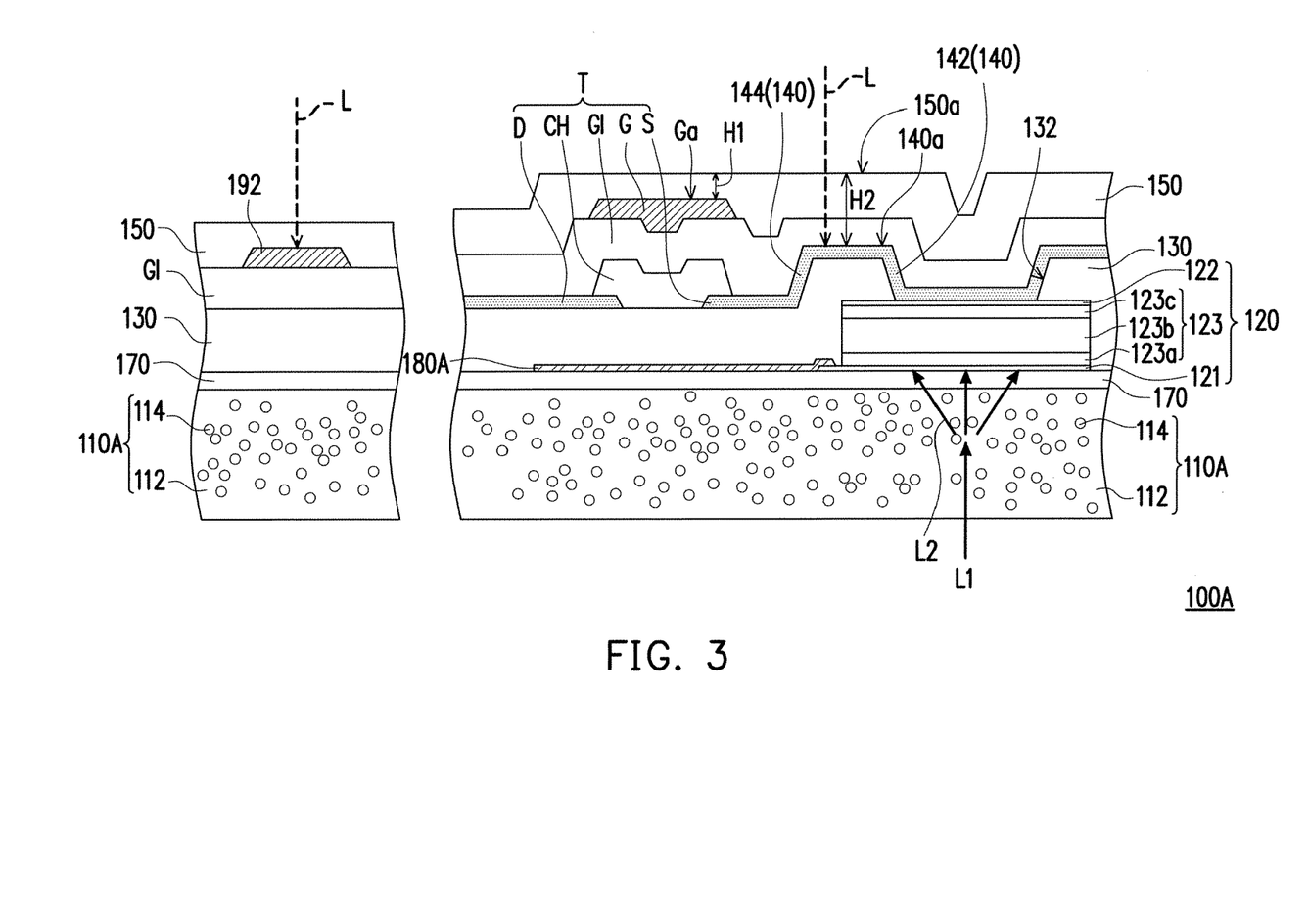
FIG. 3 is a cross-sectional view of a light detector according to another embodiment of the disclosure.

FIG. 3 is a cross-sectional view of a light detector according to another embodiment of the disclosure. A light detector 100A in FIG. 3 is similar to the light detector 100 in FIG. 2. Therefore, the same or similar elements are denoted by the same or similar reference numerals. The difference between the light detector 100A and the light detector 100 is that a light shielding pattern 180A of the light detector 100A is different from the light shielding pattern 180 of the light detector 100 in terms of electrical connection relationship with other element, and the type of an invisible light converting substrate 110A is also different. The differences between the two are described below. Meanwhile, the previous embodiment may serve as reference for the identical or similar parts between the two; no repetitions are incorporated herein.

Referring to the embodiments of FIG. 2 and FIG. 3, the light shielding pattern 180 of the light detector 100 in the previous embodiment of FIG. 2 is spaced apart from the electrode (e.g., first electrode 121) that is closer to the invisible light converting substrate 110 in the light sensing element 120. In the embodiment, the light shielding pattern 180A of the light detector 100 in the embodiment of FIG. 3 may be electrically connected with the electrode (e.g., first electrode 121) that is closer to the invisible light converting substrate 110 in the light sensing element 120. In addition, another difference between the embodiment of FIG. 3 and the previous embodiment of FIG. 2 is that the invisible light converting substrate 110A includes a first base (or namely first substrate) 112 and the invisible light wavelength converting material 114 mixed in the first base (or namely first substrate) 112. Therefore, the light detector 100A also has similar effect and advantage as the light detector 100; please refer to the previous embodiment for details, and no repetition is incorporated herein. Moreover, the type of the invisible light converting substrate 110A in the embodiment of FIG. 3 may be applied to the previous embodiment.

Figure 4:
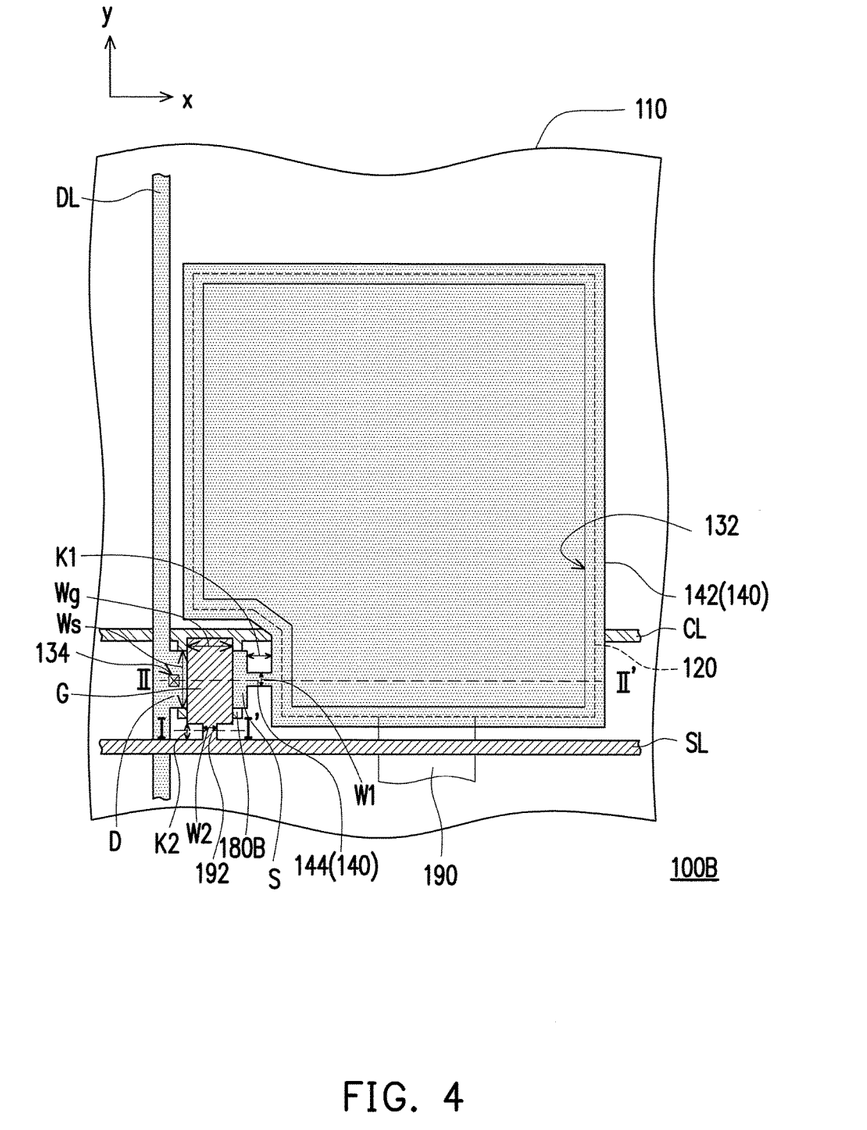
FIG. 4 is a top view of a light detector according to another embodiment of the disclosure.

FIG. 4 is a top view of a light detector according to another embodiment of the disclosure. A light detector 100B in FIG. 4 is similar to the light detector 100 in FIG. 1; the same or similar elements are denoted by the same or similar reference numeral. The difference between the light detector 100B and the light detector 100 is that a light shielding pattern 180B of the light detector 100B may be a portion of a common electrode line CL. Preferably, the common electrode line CL may be spaced apart from the electrode (e.g., first electrode 121) that is closer to the invisible light converting substrate 110, which should not be construed as a limitation to the disclosure. In other embodiment, the common electrode line CL may be electrically connected with the conductive line 190. Therefore, the light detector 100B also has similar effect and advantage as the light detector 100; please refer to the previous embodiment for details, and no repetition is incorporated herein. Furthermore, the implementation of the embodiment of FIG. 4 may be applied to the previous embodiment (e.g., FIG. 3).

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:
1. A light detector, comprising:
   an invisible light converting substrate, converting an invisible light into a visible light;
   a light sensing element, disposed on the invisible light converting substrate to detect the visible light, the light sensing element comprising:
      a first electrode and a second electrode; and
      an optoelectric converting layer, disposed between the first electrode and the second electrode, wherein the first electrode is close to the invisible light converting substrate, the second electrode is away from the invisible light converting substrate, and a material of the first electrode comprises a transparent or a semi-transparent material;
   a first protection layer, covering the invisible light converting substrate and the second electrode of the light sensing element, wherein the first protection layer comprises a via, the via is overlapped with at least part of the second electrode;
   a thin film transistor, disposed on the invisible light converting substrate, wherein the thin film transistor comprises a gate electrode, a semiconductor layer, a gate insulating layer, a source electrode and a drain electrode electrically connected with the semiconductor layer, the semiconductor layer is disposed between the gate electrode and the source electrode and between the gate electrode and the drain electrode, and the gate insulating layer is disposed between the semiconductor layer and the gate electrode;
   a first conductive pattern, disposed on the first protection layer, wherein the first conductive pattern is electrically connected with the second electrode of the light sensing element through the via of the first protection layer, and the first conductive pattern is electrically connected between the second electrode of the light sensing element and the source electrode of the thin film transistor; and
a second protection layer, covering the thin film transistor, the first conductive pattern and the light sensing element.

2. The light detector according to claim 1, wherein the light detector further comprises:
a data line, disposed on the invisible light converting substrate and electrically connected with the drain electrode; and
a scan line, disposed on the invisible light converting substrate and electrically connected with the gate electrode.

3. The light detector according to claim 2, further comprising:
a second conductive pattern, electrically connected between the gate electrode and the scan line, wherein the second conductive pattern is disposed on the gate insulating layer, the second protection layer covers the second conductive pattern.

4. The light detector according to claim 3, wherein a width of at least part of the second conductive pattern is smaller than a width of the gate electrode.

5. The light detector according to claim 1, wherein a width of at least part of the first conductive pattern is smaller than a width of the source electrode.

6. The light detector according to claim 1, wherein the first conductive pattern further covers the light sensing element.

7. The light detector according to claim 1, wherein the thin film transistor is a top gate type of the thin film transistor.

8. The light detector according to claim 1, wherein the source electrode and the drain electrode are disposed on the first protection layer; the semiconductor layer, the gate insulating layer and the gate electrode are disposed on the source electrode and the drain electrode.

9. The light detector according to claim 8, wherein the first conductive pattern is disposed between the gate insulating layer and the first protection layer.

10. The light detector according to claim 1, wherein a distance between a surface of the gate electrode and a surface of the second protection layer is smaller than a distance between a surface of the first conductive pattern and the surface of the second protection layer.

11. The light detector according to claim 1, further comprising:
a light shielding pattern, disposed between the invisible light converting substrate and the thin film transistor, wherein the light shielding pattern is overlapped with at least part of the semiconductor layer.

12. The light detector according to claim 11, wherein the light shielding pattern comprises a predetermined electrical potential.

13. The light detector according to claim 11, wherein the light shielding pattern is electrically connected with the drain electrode of the thin film transistor.

14. The light detector according to claim 11, wherein the light shielding pattern is electrically connected with the first electrode of the light sensing element.

15. The light detector according to claim 1, wherein the invisible light converting substrate comprises a first base and an invisible light wavelength converting material disposed on the first base.

16. The light detector according to claim 1, wherein the invisible light converting substrate comprises a first base and an invisible light wavelength converting material mixed in the first base.

17. The light detector according to claim 1, wherein the invisible light converting substrate comprises a first base, a second base, and an invisible light wavelength converting material disposed between the first base and the second base.

18. The light detector according to claim 1, wherein the invisible light comprises one of an infrared light, a UV light, an X-ray, and a γ-ray.

19. The light detector according to claim 1, further comprising:
a conductive line, disposed on the invisible light converting substrate, and electrically connected with the first electrode that is closer to the invisible light converting substrate in the light sensing element.

* * * * *